(12) United States Patent
Ichikawa

(10) Patent No.: US 7,071,543 B2
(45) Date of Patent: Jul. 4, 2006

(54) SEMICONDUCTOR DEVICE AND MANUFACTURING METHOD THEREOF

(75) Inventor: Sunji Ichikawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/775,166

(22) Filed: Feb. 11, 2004

(65) Prior Publication Data
US 2005/0104166 A1    May 19, 2005

(30) Foreign Application Priority Data
Nov. 17, 2003  (JP) .............................. 2003-386869

(51) Int. Cl.
*H01L 23/495*  (2006.01)
*H01L 23/48*   (2006.01)
*H01L 23/52*   (2006.01)
*H01L 29/40*   (2006.01)

(52) U.S. Cl. ............ 257/676; 257/666; 257/777; 257/723; 257/784; 257/787

(58) Field of Classification Search ............ 257/666, 257/676, 777, 723, 784, 686, 787
See application file for complete search history.

(56) References Cited

U.S. PATENT DOCUMENTS

| | | | |
|---|---|---|---|
| 5,229,960 A * | 7/1993 | De Givry | .................. 365/63 |
| 6,100,594 A * | 8/2000 | Fukui et al. | .................. 257/777 |
| 6,239,366 B1 * | 5/2001 | Hsuan et al. | ............... 174/52.3 |
| 6,252,305 B1 * | 6/2001 | Lin et al. | .................. 257/777 |
| 6,433,421 B1 | 8/2002 | Masuda et al. | |

FOREIGN PATENT DOCUMENTS

| | | |
|---|---|---|
| JP | 7-58143 | 3/1995 |
| JP | 2000-277559 | 10/2000 |
| JP | 2001-298150 | 10/2001 |
| JP | 2002-217356 | 8/2002 |
| JP | 2002-373968 | 12/2002 |
| JP | 3096721 | 7/2003 |

* cited by examiner

*Primary Examiner*—Nitin Parekh
(74) *Attorney, Agent, or Firm*—Volentine Francos & Whitt, PLLC

(57) ABSTRACT

A semiconductor device includes a die pad section, a first semiconductor chip having a surface formed with a first electrode section and a back surface fixed to the die pad section, a second semiconductor chip having a surface formed with a second electrode section and a back surface fixed to the surface of the first semiconductor chip, a support member having a surface fixed to the back surface of the second semiconductor chip and a back surface fixed to the die pad section, lead terminal sections respectively electrically connected to the first and second electrode sections, and a resin encapsulating body that seals the die pad section, the first and second semiconductor chips and the support member.

21 Claims, 15 Drawing Sheets

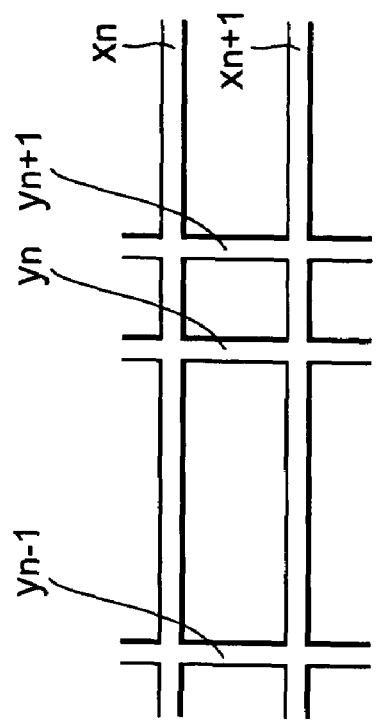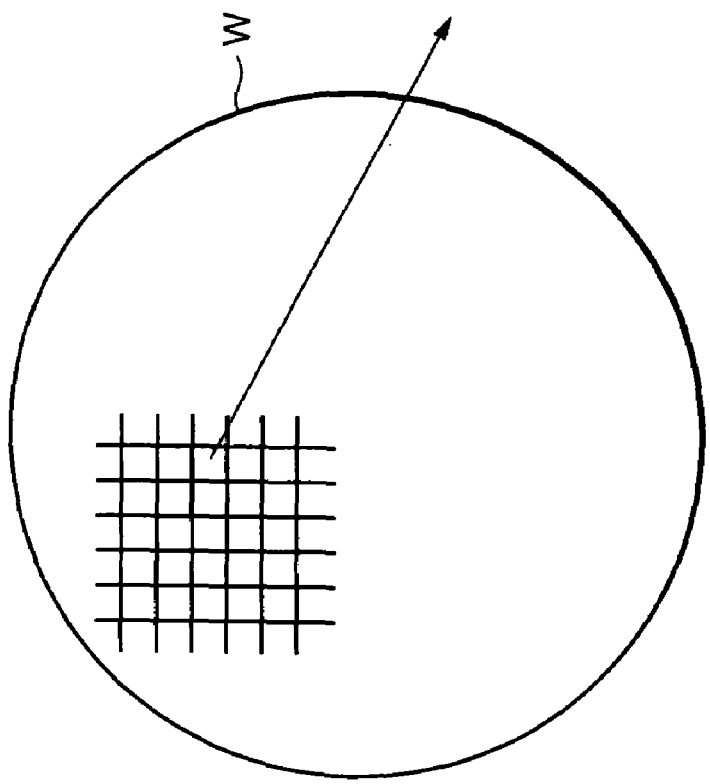

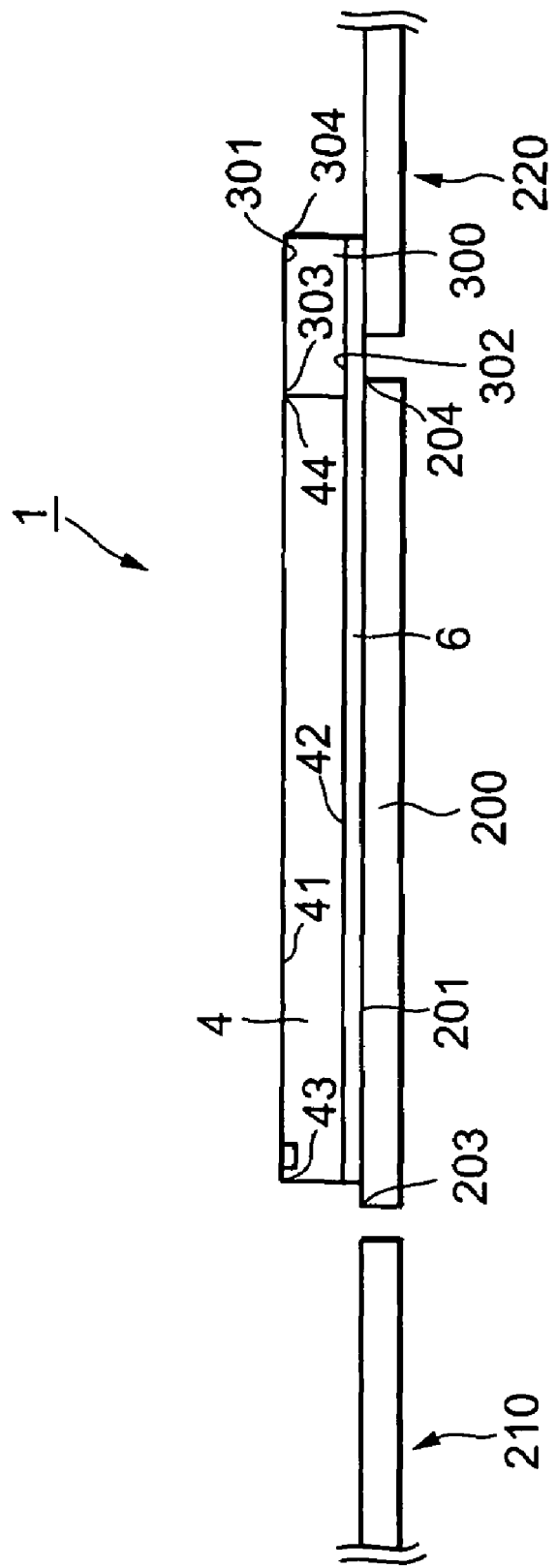

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and particularly to a semiconductor device of a semiconductor chip laminated type wherein a plurality of semiconductor chips are laminated.

2. Description of the Related Art

A conventional bonding device and a semiconductor device both aimed at improving bonding processing of metal wires have been described in the following patent documents 1 and 2 respectively. The patent document 1 describes the bonding device in which a lead terminal mounting or placement surface of a heat coma is slanted. Since lead terminals are satisfactorily brought into contact with the mounting surface of the heat coma even if the lead terminals have warpage upon fixing the lead terminals to the mounting surface of the heat coma by a window clamper in the bonding device, heat applied from the heat coma is satisfactorily transferred to the lead terminals.

The patent document 2 describes the semiconductor device wherein four semiconductor chips are laminated. In the present semiconductor device, the uppermost semiconductor chip is fixed to lead terminals, and other semiconductor chips are sequentially shifted such that electrodes of the semiconductor chips are exposed, and fixed to the upper semiconductor chip. Since the lowermost semiconductor chip is directly placed on a heat coma in the present semiconductor device, heat is easy to be transferred to the semiconductor chips.

Patent Document 1

Japanese Unexamined Patent Publication No. Hei 7(1995)-58143 (see fourth to fifth pages and FIG. 1)

Japanese Unexamined Patent Publication No. 2001-298150 (see twelfth to fourteenth pages and FIG. 7)

Although the lead terminals can be reliably brought into contact with the heat coma even when the lead terminals are warped, in the bonding device described in the patent document 1, the present patent document 1 does not mention a problem about a case in which a plurality of semiconductor chips are laminated with being shifted from one another.

When the plurality of semiconductor chips are laminated with being shifted from one another, space is defined between a protruding portion of each semiconductor chip and a lead frame. When electrodes are laid out at the protruding portion, heat from the lead frame is hard to be transferred to the protruding portion upon wire bonding, and an ultrasonic sound applied to metal wires and electrodes also escapes to the space, so that the ultrasonic sound is not satisfactorily transferred to the metal wires and electrodes. As a result, there is a possibility that the state of connections between the electrodes of the protruding portion and their corresponding metal wires will be deteriorated. There is also a fear that upon resin encapsulation, a resin flows into the space defined between the protruding portion and the lead frame, so that the protruding portion undergoes stress, thus producing a crack in the upper semiconductor chip.

The semiconductor device described in the patent document 2 has the fear that although it has the effect of causing the lowermost semiconductor chip to directly contact the heat coma to thereby improve the transfer of heat, stress is applied to protruding portions of the respective semiconductor chips upon resin sealing, thus producing cracks in these semiconductor chips.

SUMMARY OF THE INVENTION

With the foregoing in view, it is thus an object of the present invention to provide a semiconductor device capable of, when a plurality of semiconductor chips are laminated with being shifted from one another, improving connections between electrodes of a protruding portion of each semiconductor chip and their corresponding metal wires and suppressing degradation of each semiconductor chip due to stress applied upon resin encapsulation.

According to one aspect of the present invention, for attaining the above object, there is provided a semiconductor device comprising a die pad section, first and second semiconductor chips, a support member, lead terminal sections and a resin encapsulating body. The first semiconductor chip has a surface on which a first electrode section is formed, and a back surface fixed to the die pad section. The second semiconductor chip includes a surface on which a second electrode section is formed, and a back surface fixed to the surface of the first semiconductor chip. The support member has a surface fixed to the back surface of the second semiconductor chip, and a back surface fixed to the surface of the die pad section. The lead terminal sections are respectively electrically connected to the first and second electrode sections. The resin encapsulating body seals the die pad section, the first and second semiconductor chips and the support member.

In the semiconductor device according to the present invention, the second semiconductor chip (lamination side) is fixed to the first semiconductor chip (laminated side) and even to the support member. That is, the second semiconductor chip fixes a portion (protruding portion) that protrudes or extends out from the first semiconductor chip, to the support member, whereby a protruding portion of the semiconductor chip is supported by the support member. Since the support member exists in space defined between the protruding portion of the second semiconductor chip and a lead frame (die pad section and lead terminal sections), heat applied from a heat coma is satisfactorily transferred from the lead frame to the protruding portion of the second semiconductor chip through the support member even when electrodes are placed at the protruding portion. Also since the support member exists between the protruding portion of the second semiconductor chip and the lead frame, an ultrasonic sound can be transferred to metal wires satisfactorily. As a result, the electrodes of the protruding portion and the metal wires can be reliably connected.

Since the support member exists in the space defined between the protruding portion and the lead frame, the flowing of a resin into the space between the protruding portion and the lead frame can be suppressed in a resin encapsulating process. Consequently, it is possible to prevent the occurrence of cracks in the second semiconductor chip by application of excessive stress to the protruding portion in the resin encapsulating process.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 9 shows a semiconductor wafer formed with semiconductor chips and support members;

FIG. 10 is a cross-sectional view for describing a manufacturing process of the semiconductor device 1 according to the second embodiment of the present invention;

DETAILED DESCRIPTION OF THE INVENTION

Preferred embodiments of the present invention will be described hereinbelow with reference to the accompanying drawings.

<First Embodiment>

Figure 1:
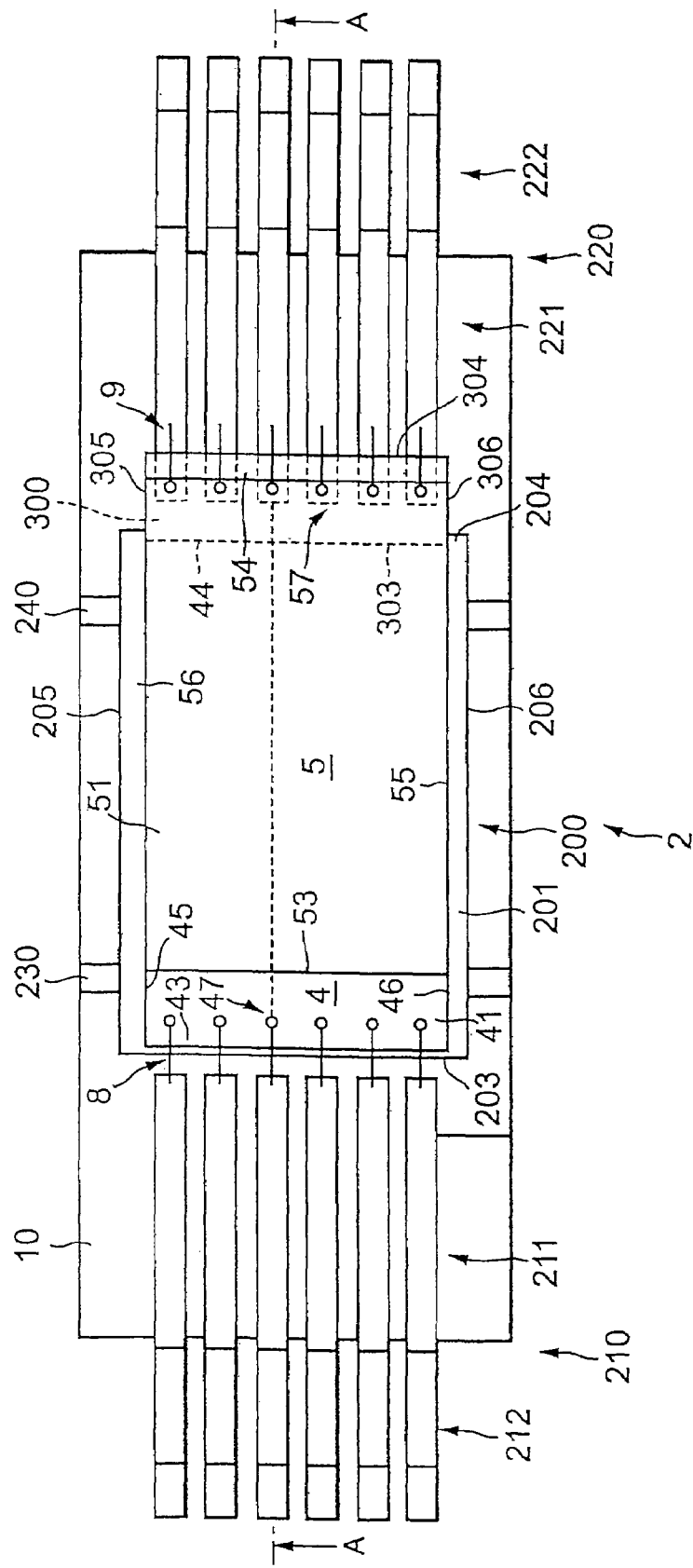
FIG. 1 is a plan view of a semiconductor device 1 according to a first embodiment of the present invention.
Figure 2:
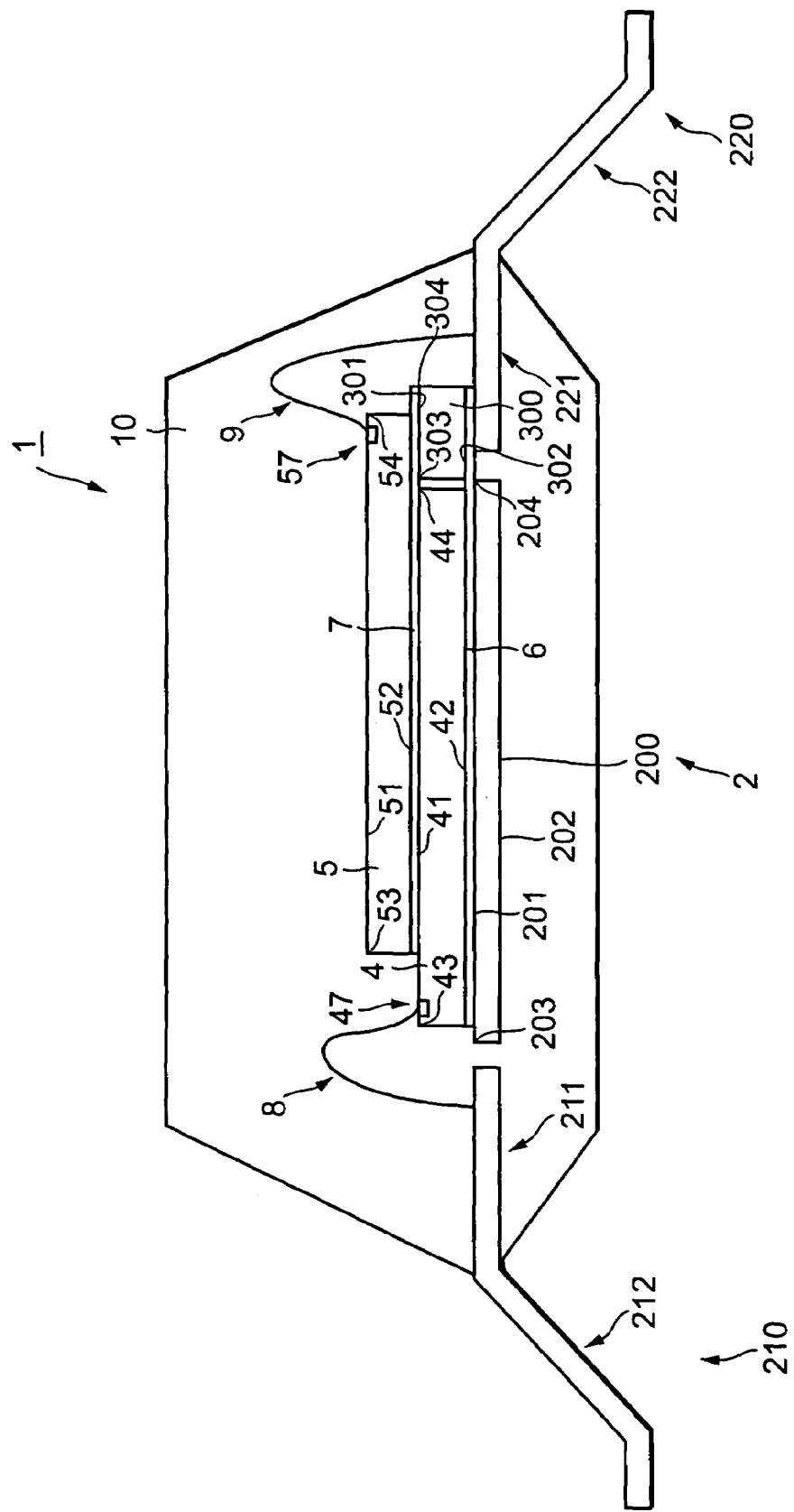
FIG. 2 is a cross-sectional view of the semiconductor device 1 according to the first embodiment of the present invention.

FIG. 1 is a top perspective diagram (corresponding to a diagram from which an upper resin encapsulating body is omitted) of a semiconductor device 1 according to a first embodiment of the present invention, and FIG. 2 is a cross-sectional view taken along line A—A of FIG. 1, respectively. The semiconductor device 1 is a semiconductor memory device, for example.

The semiconductor device 1 comprises a lead frame 2 having a die pad section 200 and lead terminal sections 210 and 220, semiconductor chips 4 and 5, a support member 300 and wiring sections 8 and 9 made up of a plurality of metal wires.

The lead frame 2 includes the die pad section 200, the lead terminal sections 210 and 220 disposed on both sides of the die pad section 200 with a predetermined interval (0.5 mm, for example) defined therebetween, and support portions 230 and 240 for supporting the die pad section 200. The die pad section 200 is shaped in the form of a substantially rectangle as seen in the flat surface and has surfaces 201 and 202 opposite to each other. The surface 201 includes sides 203 and 204 opposite to each other, and sides 205 and 206 respectively adjacent to the sides 203 and 204 and opposite to each other. The die pad section 200 is fixed to the support portions 230 and 240. The lead terminal section 210 comprises a plurality of lead terminals. The plurality of lead terminals of the lead terminal section 210 are disposed along the side 203 with a predetermined interval (0.5 mm, for example) with respect to the side 203 on the side 203 side of the die pad section 200. The lead terminal section 210 has inner portions 211 disposed inside the resin encapsulating body 10, and outer portions 212 disposed outside the resin encapsulating body 10. The outer portions 212 are respectively bent in matching with the layout of external terminals. The lead terminal section 220 consists of a plurality of lead terminals. The plurality of lead terminals of the lead terminal section 220 are disposed along the side 204 with a predetermined interval (0.5 mm, for example) with respect to the side 204 on the side 204 side of the die pad section 200. The lead terminal section 220 includes inner portions 221 disposed inside the resin encapsulating body 10, and outer portions 222 disposed outside the resin encapsulating body 10. The outer portions 222 are respectively bent in matching with the layout of external terminals. The lead terminal section 210 and the lead terminal section 220 are disposed so as to be opposed to each other with the die pad section 200 interposed therebetween.

The semiconductor chip 4 is substantially rectangular as seen in the plane surface and has surfaces 41 and 42 opposite to each other, sides 43 and 44 opposite to each other, and sides 45 and 46 opposite to each other. In the present embodiment, the lengths of the sides 43 and 44 each corresponding to the short side of the semiconductor chip 4 are 7.8 mm, and the lengths of the sides 45 and 46 each corresponding to the long side thereof are 11.4 mm. The thickness of the semiconductor chip 4 ranges from 150 μm to 200 μm. The semiconductor chip 4 has an electric circuit such as a memory circuit, having predetermined functions, and an electrode section 47 for electrically connecting the electric circuit to the lead terminal section 210. The electrode section 47 is disposed on the side 43 side of the surface 41 of the semiconductor chip 4. The electrode section 47 comprises a plurality of electrodes and is disposed along the side 43. The semiconductor chip 4 is fixed to the surface 201 of the die pad section 200 over the entire surface of the surface 42 by an adhesive sheet 6 such that the side 43 is disposed on the side 203 side of the die pad section 200. In the present embodiment, the length between the side 43 of the semiconductor chip 4 and the side 203 of the die pad section 200 is 0.5 mm.

The support member 300 is a member for supporting a protruding portion corresponding to a portion of the semiconductor chip 5 to be described later, which protrudes outside the semiconductor chip 4. The support member 300 is shaped substantially in the form of a rectangle as seen in the plane surface and has surfaces 301 and 302 opposite to each other, sides 303 and 304 opposite to each other, and sides 305 and 306 opposite to each other. In the present embodiment, the lengths of the sides 305 and 306 of the support member 300 are 1.1 mm, and the lengths of the sides 303 and 304 are equal to the short side of the semiconductor chip 4 and are 7.8 mm. Incidentally, the lengths of the sides 305 and 306 may be greater than or equal to the length (length between the sides 44 and 54 in FIGS. 1 and 2) of the protruding portion corresponding to the portion of the semiconductor chip 5 to be described later, which protrudes outside the semiconductor chip 4. In the present embodiment, the length of the protruding portion is 11.0 mm, and the lengths of the sides 305 and 306 are greater than or equal to 11.0 mm. The thickness of the support member 300 ranges from 150 μm to 200 μm in a manner similar to the semiconductor chip 4. While the side 303 of the support member 300 may preferably be disposed in absolute contact with the side 44 of the semiconductor chip 4, no problem comes up if a gap of about a few tens of μm occurs.

The support member 300 may be either an insulator or a conductor. The support member 300 can be formed of, for example, silicon having no conductivity. When the support member 300 is formed of silicon, it can be formed on a semiconductor wafer made of silicon.

The semiconductor chip 5 has surfaces 51 and 52 opposite to each other, sides 53 and 54 opposite to each other, and sides 55 and 56 opposite to each other. The semiconductor chip 5 has the same shape and size as the semiconductor chip 4. That is, the lengths of the sides 53 and 54 each corresponding to the short side of the semiconductor chip 5 are 7.8 mm, and the sides 55 and 56 each corresponding to the long side thereof are 11.4 mm. The thickness of the semiconductor chip 5 ranges from 150 μm to 200 μm. The semiconductor chip 5 has an electric circuit having the same function as that of the electric circuit of the semiconductor chip 4 and includes an electrode section 57 for electrically connecting the electric circuit to the lead terminal section 220. The electrode section 57 is disposed on the side 54 side of the surface 51. The electrode section 57 comprises a plurality of electrodes and is disposed along the side 54.

The semiconductor chip 5 is fixed to the semiconductor chip 4 by means of an adhesive sheet 7 in a state in which the surface 52 is being directed to the surface 41 of the semiconductor chip 4. Described in more detail, the semiconductor chip 5 is fixed to the semiconductor chip 4 in such a manner that the side 53 of the semiconductor chip 5 is located inside the side 43 of the semiconductor chip 4, and the side 54 of the semiconductor chip 5 is placed outside the side 44 of the semiconductor chip 4 and at substantially the same position as the side 304 of the support member 300 or inside the side 304 thereof. That is, as shown in FIG. 1, the portion of the semiconductor chip 5, which protrudes from the semiconductor chip 4, is supported by the support member 300.

The wiring section 8 electrically connects the electrode section 47 to the lead terminal section 210 lying on the near side as viewed from the electrode section 47. The wiring section 8 comprises a plurality of the metal wires. The metal wires of the wiring section 8 are respectively crimped onto the electrodes of the electrode section 47 and the lead terminals of the lead terminal section 210 by wire bonding. The wiring section 9 electrically connects the electrode section 57 to the lead terminal section 220 lying on the near side as viewed from the electrode section 57. The wiring section 9 comprises a plurality of the metal wires. The metal wires of the wiring section 9 are respectively crimped onto the electrodes of the electrode section 57 and the lead terminals of the lead terminal section 220 by wire bonding.

The resin encapsulating body 10 seals the lead frame 2, the semiconductor chips 4 and 5, the support member 300 and the wiring sections 8 and 9 for the purpose of protecting the respective parts. Described in more detail, the inner portions 211 and 221 of the lead terminal sections 210 and 220 are sealed with the resin encapsulating body 10, whereas the outer portions 212 and 222 of the lead terminal sections 210 and 220 are exposed outside of the resin encapsulating body 10.

FIGS. 3 through 7 are respectively cross-sectional views for describing a method of manufacturing the semiconductor device 1 according to the present embodiment.

Figure 3:
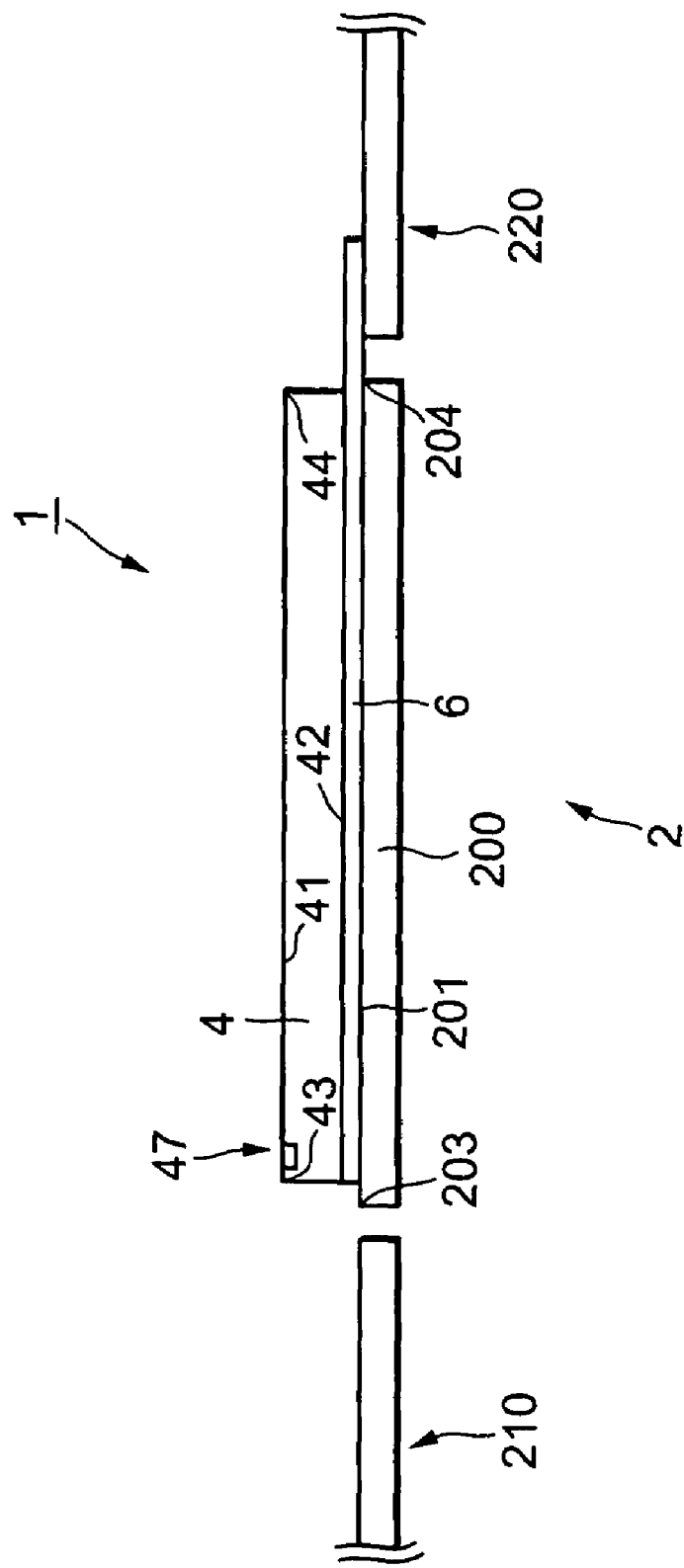
FIG. 3 is a cross-sectional view for describing a manufacturing process of the semiconductor device 1 according to the first embodiment of the present invention.

As shown in FIG. 3, an adhesive sheet 6 is bonded onto a surface 201 of a die pad section 200 and an upper surface of a lead terminal section 220. Next, a semiconductor chip 4 is adhered to the die pad section 200 and the lead terminal section 220 by the adhesive sheet 6 in such a manner that a surface 42 of the semiconductor chip 4 is directed to a surface 201 of the die pad section 200 and a side 43 thereof is located on the side 203 side. At this time, the side 43 of the semiconductor chip 4 is located inside by 0.5 mm from the side 203 of the die pad section 200.

Figure 4:
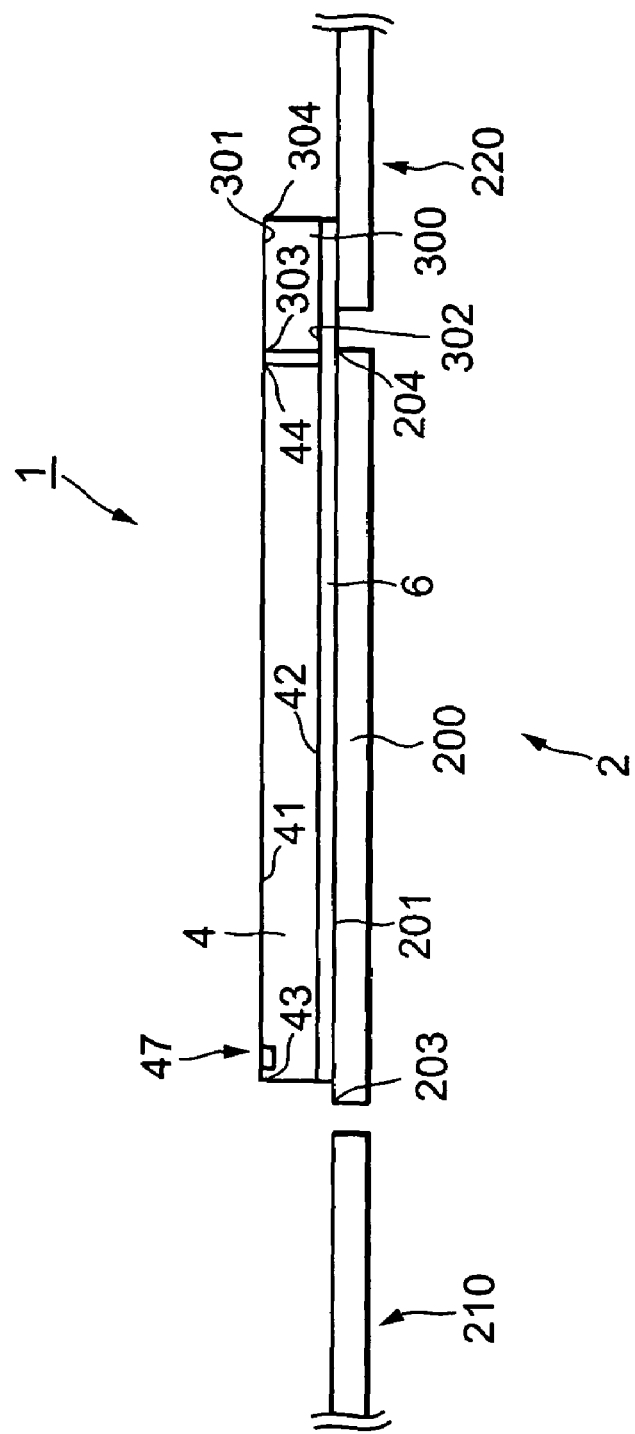
FIG. 4 is a cross-sectional view for describing the manufacturing process of the semiconductor device 1 according to the first embodiment of the present invention.

Next, as shown in FIG. 4, a support member 300 is disposed such that a side 300 thereof is placed face to face with a side 44 of the semiconductor chip 4. The support member 300 is bonded onto the adhesive sheet 6 in alignment with the semiconductor chip 4. At this time, the support member 300 is disposed such that a surface 302 thereof contacts the adhesive sheet 6 and a surface 301 thereof extends along a surface 41 of the semiconductor chip 4. While the side 303 of the support member 300 may preferably be adhered to the side 44 of the semiconductor chip 4, a gap of about a few tens of μm may be provided between the side 303 and the side 44.

Figure 5:
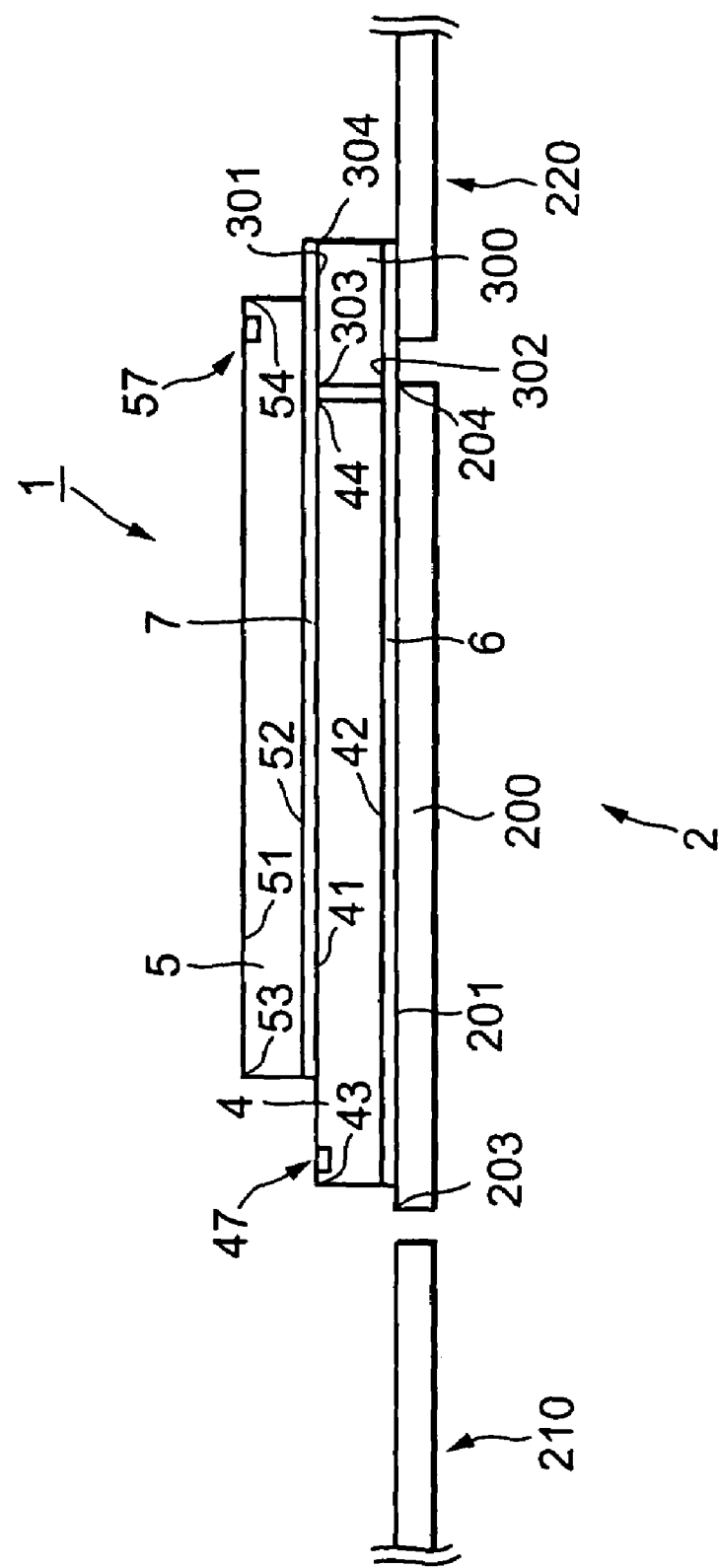
FIG. 5 is a cross-sectional view for describing the manufacturing process of the semiconductor device 1 according to the first embodiment of the present invention.

Next, as shown in FIG. 5, an adhesive sheet 7 is bonded onto the surface 41 of the semiconductor chip 4 and the surface 301 of the support member 300. Then, a semiconductor chip 5 is adhered to the semiconductor chip 4 and the support member 300 by the adhesive sheet 7. At this time, the semiconductor chip 5 is fixed to the semiconductor chip 4 and the support member 300 in such a manner that in a state in which a surface 52 of the semiconductor chip 5 is placed face to face with the surface 41 of the semiconductor chip 4, a side 53 of the semiconductor chip 5 is located inside the side 43 and a side 54 thereof is located outside the side 44 and inside a side 304 of the support member 300. The length (length of the side 54 of the semiconductor chip 5, which protrudes outside the side 44 of the semiconductor chip 4) of its protruding portion corresponds to the length of the side 53 of the semiconductor chip 5, which is shifted inwardly of the side 43 of the semiconductor chip 4. The length of the protruding portion may be such a length that an electrode section 47 of the semiconductor chip 4 is exposed and the electrode section 47 and a lead terminal section 210 become wirable. Here, the length of the protruding portion is set to 1.0 mm. Incidentally, while the side 54 of the semiconductor chip 5 is placed so as to extend up to above the lead terminal section 220, the side 54 might not reach up to above the lead terminal section 220 depending on the amount of displacement of the semiconductor chip 5 from the semiconductor chip 4.

Figure 6:
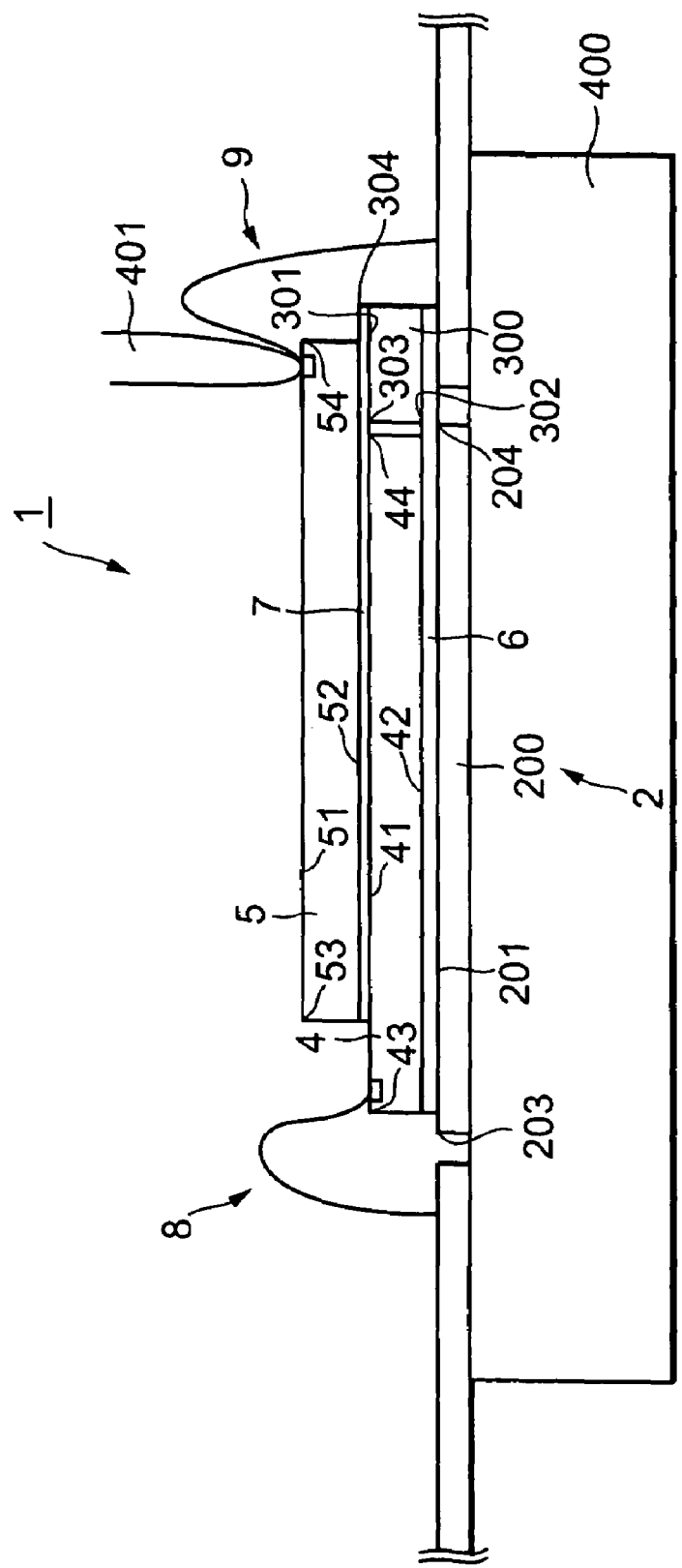
FIG. 6 is a cross-sectional view for describing the manufacturing process of the semiconductor device 1 according to the first embodiment of the present invention.

Next, as shown in FIG. 6, a lead frame 2 is mounted to a bonding device, where wire bonding is effected thereon. The bonding device comprises a heat coma 400 used as a heater for heating the lead frame 2, semiconductor chips 4 and 5, etc., and a capillary 401 used as an ultrasonic crimping apparatus for applying an ultrasonic sound to metal wires. The lead frame 2 is placed on the heat coma 400 and the respective metal wires of wring sections 8 and 9 are connected to their corresponding electrodes of the electrode section 47 and electrode section 57 and crimped onto their corresponding lead terminals of the lead terminal sections 210 and 220. Described specifically, while the semiconductor chips 4 and 5 are being heated by the heat coma 400, the capillary 401 applies the ultrasonic sound to the metal wires to crimp the metal wires onto the electrodes and lead terminals.

Since, at this time, the support member 300 is disposed between the protruding portion of the semiconductor chip 5 and the lead frame 2, heat produced from the heat coma 400 is satisfactorily transferred from the die pad section 200 and the lead terminal section 220 to the semiconductor chip 5 through the semiconductor chip 4 and the support member 300 so that the electrodes (electrode section 57) of the protruding portion are suitably heated. When there is space between the protruding portion and the lead frame 2, a problem arises in that the ultrasonic sound applied to the metal wires upon crimping the metal wires (wiring section 9) onto the electrodes (electrode section 57) of the protruding portion escapes from the space. However, the ultrasonic sound applied from the capillary 401 is satisfactorily transferred to the metal wires owing to the placement of the support member 300 in the space. As a result, the electrodes of the protruding portion and the metal wires can be reliably connected.

Figure 7:
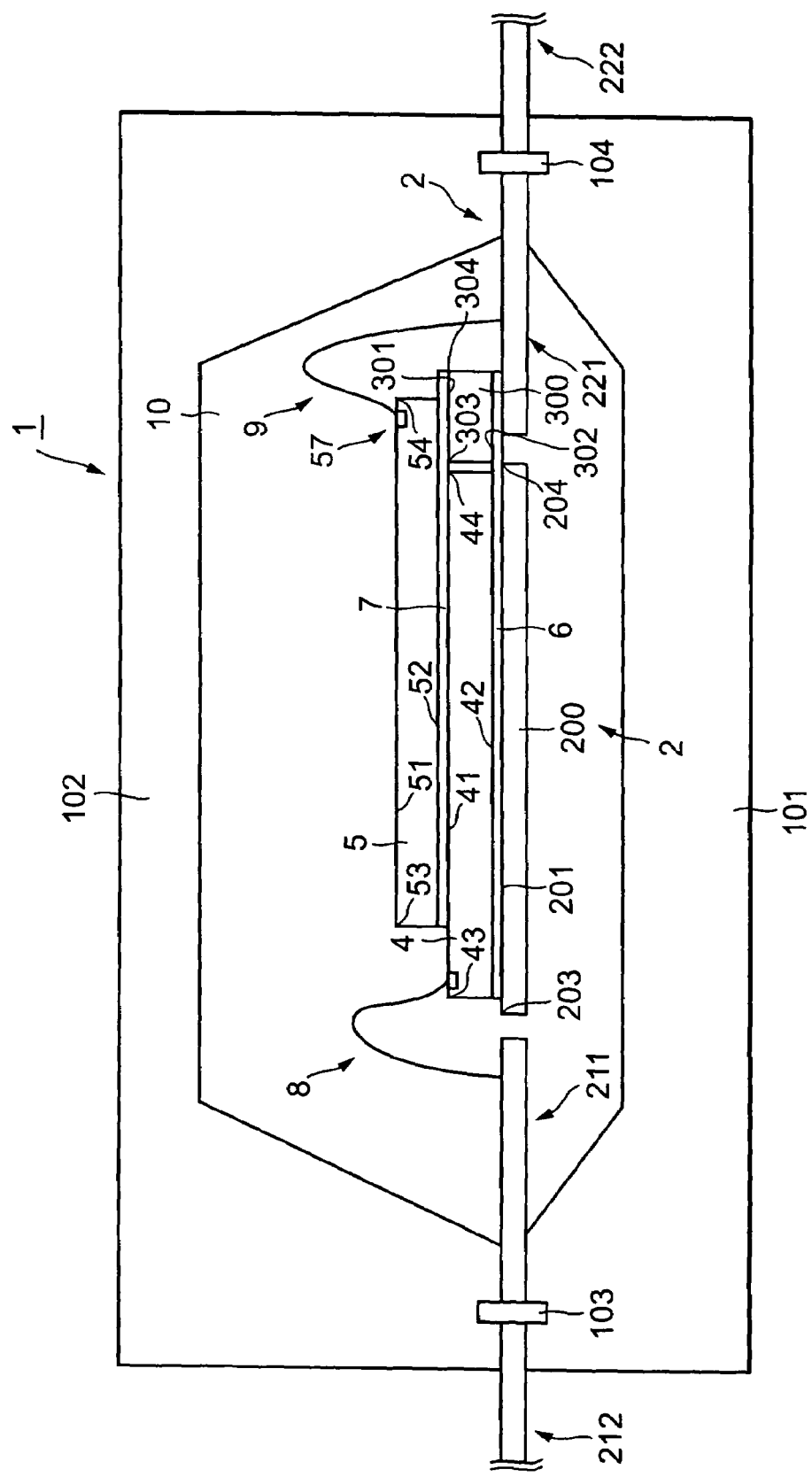
FIG. 7 is a cross-sectional view for describing the manufacturing process of the semiconductor device 1 according to the first embodiment of the present invention.

As shown in FIG. 7, the lead terminal sections 210 and 220 of the lead frame 2 are respectively fixed to dies 101 and 102 by pins 103 and 104, and a resin is encapsulated therein by a transfer molding method to form or mold a resin encapsulating body 10. At this time, the lead frame 2 is fixed to the dies 101 and 102 in such a manner that inner portions 211 and 221 of the lead terminal sections 210 and 220 are accommodated inside the dies 101 and 102 and outer portions 212 and 222 of the lead terminal sections 210 and 220 are disposed outside the dies 101 and 102.

When the space is defined between the protruding portion and the lead frame 2, the resin flows into the space upon resin encapsulation so that the protruding portion undergoes stress in the direction (direction in which it is lifted up) in which it is spaced away from the lead frame 2. In particular, the stress concentrates on the boundary portion (portion above the side 44 of the semiconductor chip 4) between the protruding portion and the semiconductor chip 4, so that the semiconductor chip is in danger of producing a crack. On the other hand, since the support member 300 is disposed in the space defined between the protruding portion and the lead frame 2 in the present embodiment, it is possible to prevent the resin from flowing into the space between the protruding portion and the lead frame 2 upon resin sealing and thereby prevent the occurrence of the crack in the semiconductor chip 5.

The lead frame 2 fixed with the resin encapsulating body 10 is detached from the dies 101 and 102. Thereafter, the extra portions of the outer portions 212 and 222 of the lead terminal sections 210 and 220 are cut. Then, the outer portions 212 and 222 of the lead terminal sections 210 and 220 are bent in matching with the layout of external terminals, thus leading to their completion.

In the present embodiment, the semiconductor chip 4 and the semiconductor chip 5 are laminated on and fixed to the die pad section 200, and the support member 300 is interposed between the protruding portion of the semiconductor chip 5, which protrudes outside the semiconductor chip 4, and the lead frame 2. Thus, when the metal wires (wiring section 9) are bonded onto their corresponding electrodes (electrode section 57) of the protruding portion, the heat produced from the heat coma 400 is satisfactorily transferred to the electrodes of the protruding portion through the support member 300. Since the support member 300 exists in the space between the protruding portion and the lead frame 2, the ultrasonic sound produced from the capillary 401 is satisfactorily transferred to the metal wires. As a result, the metal wires can be reliably connected to their corresponding electrodes of the protruding portion.

When the space exists between the protruding portion and the lead frame 2, the resin flows into the space so that the protruding portion undergoes stress in the direction (direction in which it is lifted up) in which it is spaced away from the lead frame 2. In particular, the stress concentrates on the boundary portion (portion above the side 44 of the semiconductor chip 4) between the protruding portion and the semiconductor chip 4, so that the semiconductor chip 5 is in danger of producing a crack. On the other hand, since the support member 300 exists in the space defined between the protruding portion and the lead frame 2 in the present embodiment, it is possible to prevent the resin from flowing into the space between the protruding portion and the lead frame 2 upon resin sealing and thereby prevent the occurrence of the crack in the semiconductor chip 5.

The support member 300 may preferably be formed so as to support the entire protruding portion of the semiconductor chip 5. However, the support member 300 may be formed so as to support some of the protruding portion of the semiconductor chip 5. That is, even when the support member 300 is smaller than the protruding portion of the semiconductor chip 5 and supports part of the protruding portion, the transfer of the heat and ultrasonic sound can be made satisfactory upon bonding of the metal wires, and the flowing of the resin in the space defined between the protruding portion and the lead frame 2 can be suppressed.

<Second Embodiment>

Figure 8:
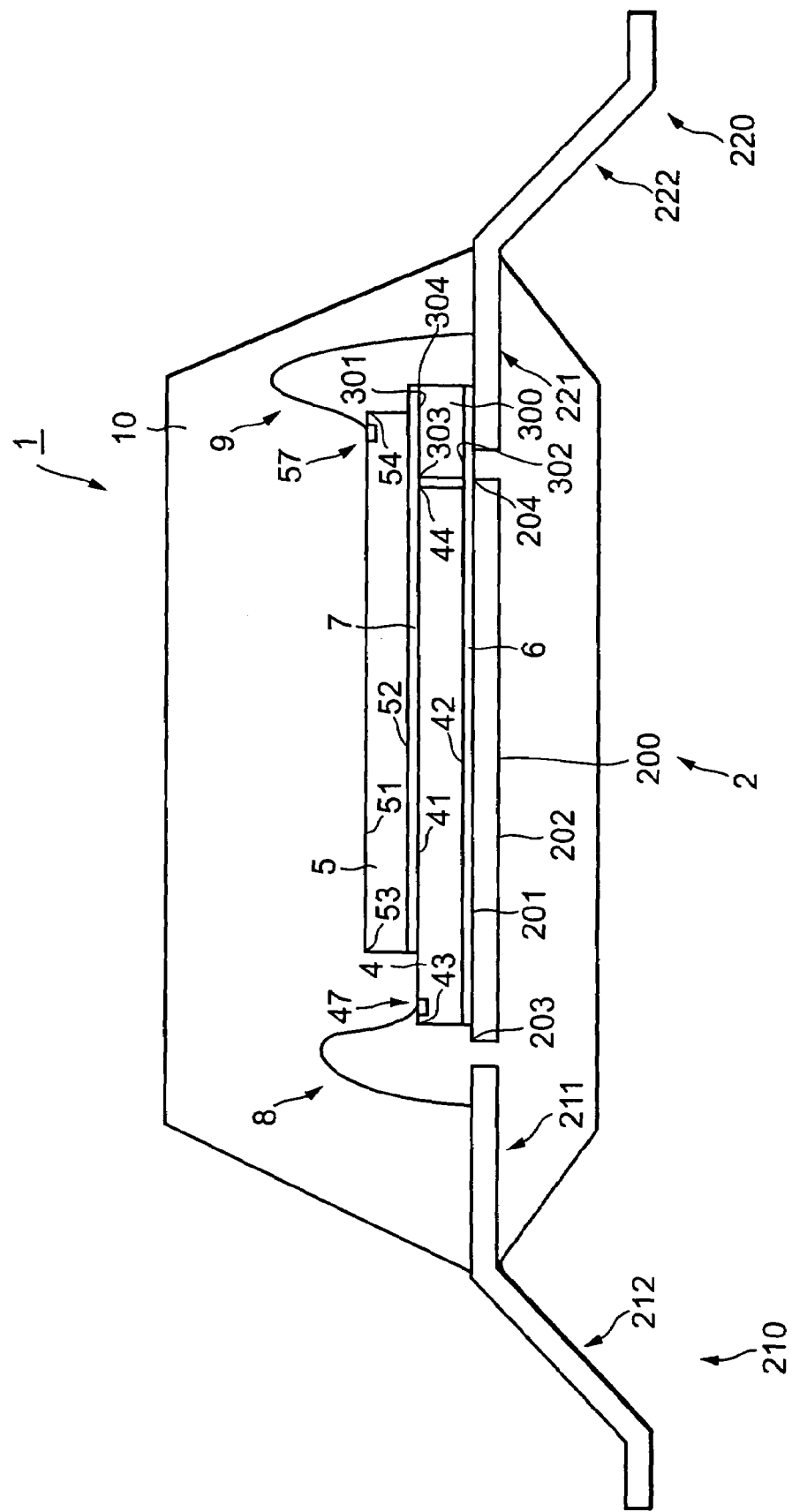
FIG. 8 is a cross-sectional view of a semiconductor device 1 according to a second embodiment of the present invention.

FIG. 8 is a cross-sectional view of a semiconductor device 1 according to a second embodiment of the present invention. In FIG. 8, components similar to those employed in the first embodiment are respectively identified by the same reference numerals, and the description thereof will therefore be omitted. A plan view of the semiconductor device 1 according to the second embodiment is similar to FIG. 1 according to the first embodiment. The present embodiment is different from the first embodiment in that a semiconductor chip 4 and a support member 300 are integrally formed.

The semiconductor chip 4 and the support member 300 according to the present embodiment are formed on such a semiconductor wafer W as shown in FIG. 9($a$). The semiconductor chip 4 and the support member 300 are formed by being partitioned by scribe lines xi (where i=1, . . . n . . . ) and yj (where j=1, . . . n . . . ) for separating the semiconductor wafer W into respective chips as shown in FIG. 9($b$).

Upon formation of the semiconductor chip 4 and the support member 300, a semiconductor wafer W unformed with elements is prepared, and an electric circuit of the semiconductor chip 4 is formed in its corresponding circuit forming region of circuit forming regions and circuit non-forming regions partitioned by the scribe lines xi and yj, followed by cutting of the wafer W along the scribe lines xi and yj. However, the scribe lines yj are cut on alternate lines without cutting the adjacent scribe lines to separate, in an integral state, the circuit forming region and the circuit non-forming region that become the semiconductor chip 4 and the support member 300. In FIG. 9($b$) by way of example, the wafer is cut along the scribe lines xn and xn+1 and then cut along the scribe lines yn−1 and yn+1, whereas the wafer is not cut along the scribe line yn and the scribe line yn is left behind. Thus, each of the circuit forming regions and each of the circuit non-forming regions can be respectively separated integrally as the semiconductor chip 4 and the support member 300.

A semiconductor chip 5 includes an electric circuit having the same function as the electric circuit of the semiconductor chip 4 and has the same shape and size. Therefore, the circuit forming regions and the circuit non-forming regions in the semiconductor wafer W shown in FIG. 9 are separated in several, and each of the circuit forming regions separated aside from the circuit non-forming regions may be used as the semiconductor chip 5. In this case, the scribe lines are cut for each line inclusive of the adjacent scribe lines yj to use each circuit forming region as the semiconductor chip 5. In FIG. 9(b), for example, the scribe lines xn, xn+1 and yn−1, yn and yn+1 are cut to separate the circuit forming regions and the circuit non-forming regions in several. Incidentally, a semiconductor wafer formed with circuit forming regions alone may be used to form each individual semiconductor chip 5 in order to obtain the semiconductor chip 5.

A method of manufacturing the semiconductor device 1 by using the semiconductor chip 4, support member 300 and semiconductor chip 5 will next be described with reference to FIGS. 10 and 11.

As shown in FIG. 10, an adhesive sheet 6 is adhered to a die pad section 200 and a lead terminal section 220 of a lead frame 2. The integrally-formed semiconductor chip 4 and support member 300 are fixed to the die pad section 200 and lead terminal section 220 by the adhesive sheet 6. At this time, a surface 42 of the semiconductor chip 4 is placed face to face with a surface 201 of the die pad section 200, and a side 43 thereof is disposed on the side 203 side of the die pad section 200.

Figure 11:
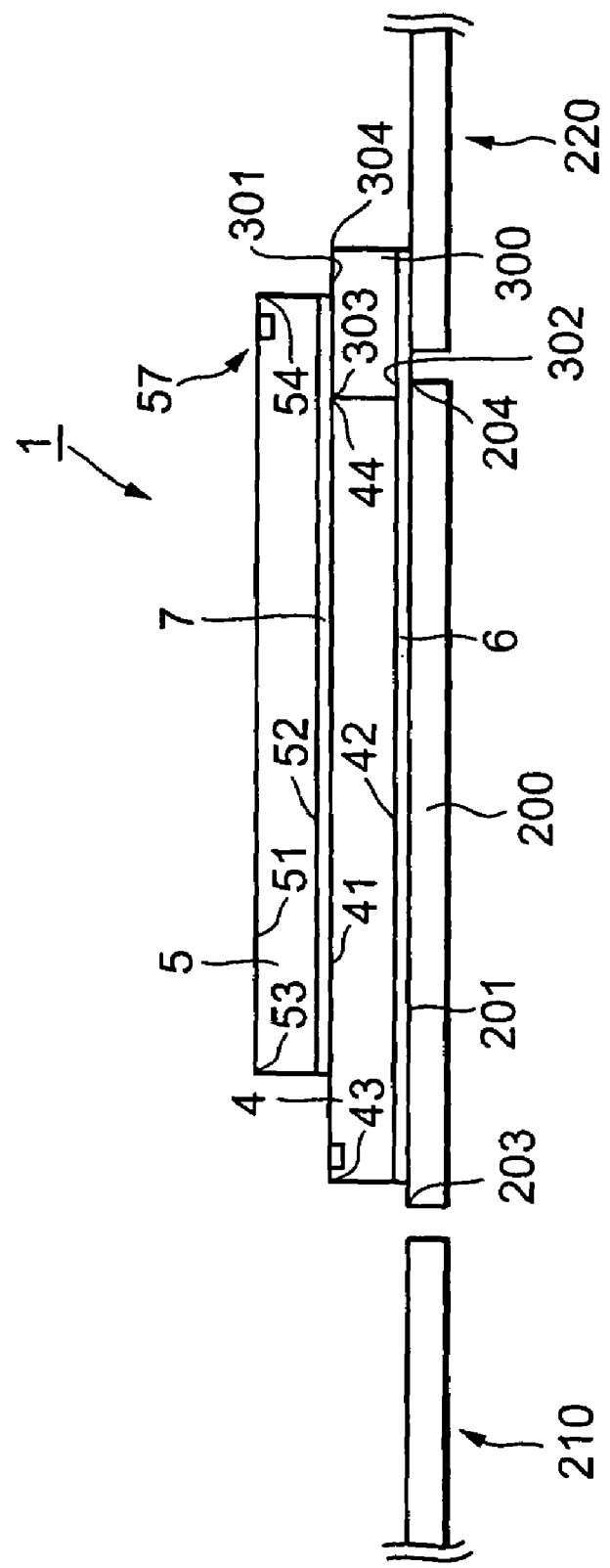
FIG. 11 is a cross-sectional view for describing a manufacturing process of the semiconductor device 1 according to the second embodiment of the present invention.

Next, as shown in FIG. 11, an adhesive sheet 7 is adhered to a surface 41 of the semiconductor chip 4 and a surface 301 of the support member 300. The semiconductor chip 5 is bonded onto the surface 41 and the surface 301 by the adhesive sheet 7. At this time, the semiconductor chip 5 is fixed to the semiconductor chip 4 and the support member 300 in such a manner that in a state in which a surface 52 of the semiconductor chip 5 is placed face to face with the surface 41 of the semiconductor chip 4, a side 53 of the semiconductor chip 5 is located inside the side 43 and a side 54 thereof is placed outside a side 44 of the semiconductor chip 4 and inside a side 304 of the support member 300. The length (length of the side 54 of the semiconductor chip 5, which protrudes outside the side 44 of the semiconductor chip 4) of its protruding portion corresponds to the length of the side 53 of the semiconductor chip 5, which is shifted inwardly of the side 43 of the semiconductor chip 4. The length of the protruding portion may be such a length that an electrode section 47 of the semiconductor chip 4 is exposed and the electrode section 47 and a lead terminal section 210 become wirable. Here, the length of the protruding portion is set to 1.0 mm. Incidentally, while the side 54 of the semiconductor chip 5 is placed so as to extend to above the lead terminal section 220 here, the side 54 might not reach up to above the lead terminal section 220 depending on the amount of displacement of the semiconductor chip 5 from the semiconductor chip 4. Although the adhesive sheet 7 is used here, an adhesive may be applied onto the surface 41 and surface 301 of the semiconductor chip 4 and support member 300. Since the semiconductor chip 4 and the support member 300 are integrally formed and no gap is defined between the side 44 of the semiconductor chip 4 and its corresponding side 303 of the support member 300, no problem occurs even if the adhesive is applied onto the surface 41 of the semiconductor chip 4 and the surface 301 of the support member 300.

The following processes are similar to FIGS. 6 and 7 employed in the first embodiment.

When the support member 300 and the semiconductor chip 4 are formed separately, there is a fear that they vary in thickness, and a step might occur between the surface 41 of the semiconductor chip 4 and the surface 301 of the support member 300. When the semiconductor chip 5 is fixed to the surface 41 and the surface 301 where the step exists between the semiconductor chip 4 and the support member 300, there is a possibility that the semiconductor chip 5 is fixed aslant to the die pad section 200 and the semiconductor chip 4. When the semiconductor chip 5 is disposed aslant, the ultrasonic sound is not satisfactorily transferred from a capillary 401 to metal wires upon crimping the metal wires (wiring section 9) onto their corresponding electrodes (electrode section 57) of the semiconductor chip 5, thus causing a risk of deteriorating electrical connections between the metal wires and the electrodes.

On the other hand, in the semiconductor device 1 according to the present embodiment, the semiconductor chip 4 and the support member 300 are formed in the same semiconductor wafer W and separated in an integral state. It is therefore possible to prevent the occurrence of the step between the semiconductor chip 4 and the support member 300.

The semiconductor chip 5 includes the electric circuit having the same function as the electric circuit of the semiconductor chip 4 and has the same shape and size. Therefore, the circuit forming regions and the circuit non-forming regions in the semiconductor wafer W shown in FIG. 9 are separated in several, and each of the circuit forming regions separated aside from the circuit non-forming regions can be used as the semiconductor chip 5. That is, if the circuit forming region and the circuit non-forming region are separated in an integral state from the semiconductor wafer W fabricated in the same process, then the integrally-formed semiconductor chip 4 and support member 300 can be obtained. If the circuit forming region and the circuit non-forming region are separated in several, then the semiconductor chip 5 can be obtained. Therefore, the manufacturing process can be simplified and a cost reduction can also be achieved.

When the support member 300 is formed in isolation from the semiconductor chip 4, the process of positioning the support member 300 onto the lead frame 2 and bonding them to each other was required in addition to the process of positioning the semiconductor chip 4 to the lead frame 2 and bonding them to each other. However, if the semiconductor chip 4 and the support member 300 are integrally formed as in the present embodiment, then the semiconductor chip 4 and the support member 300 can be positioned and bonded to the lead frame 2 in one process.

<Third Embodiment>

Figure 12:
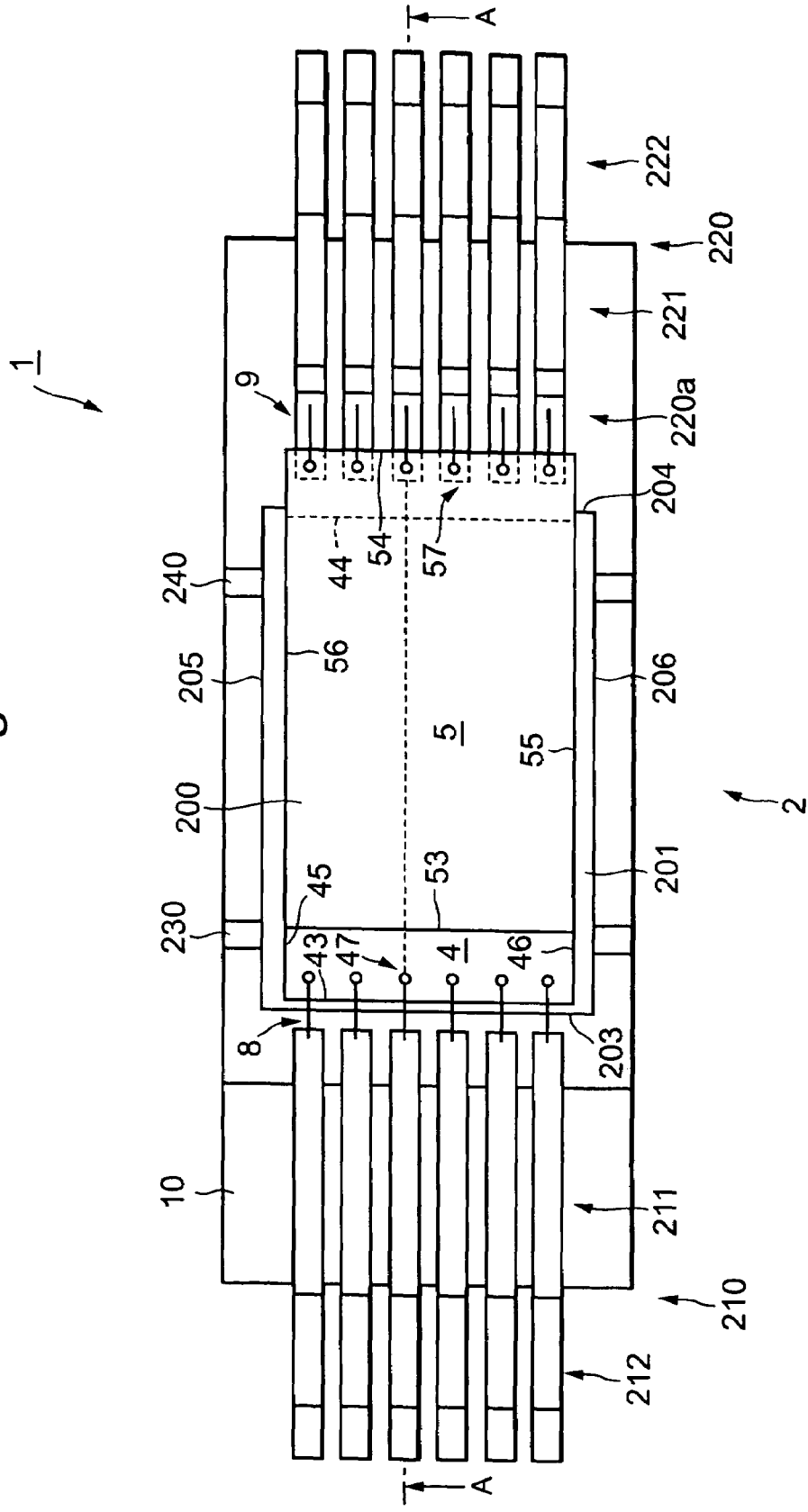
FIG. 12 is a plan view of a semiconductor device 1 according to a third embodiment of the present invention.
Figure 13:
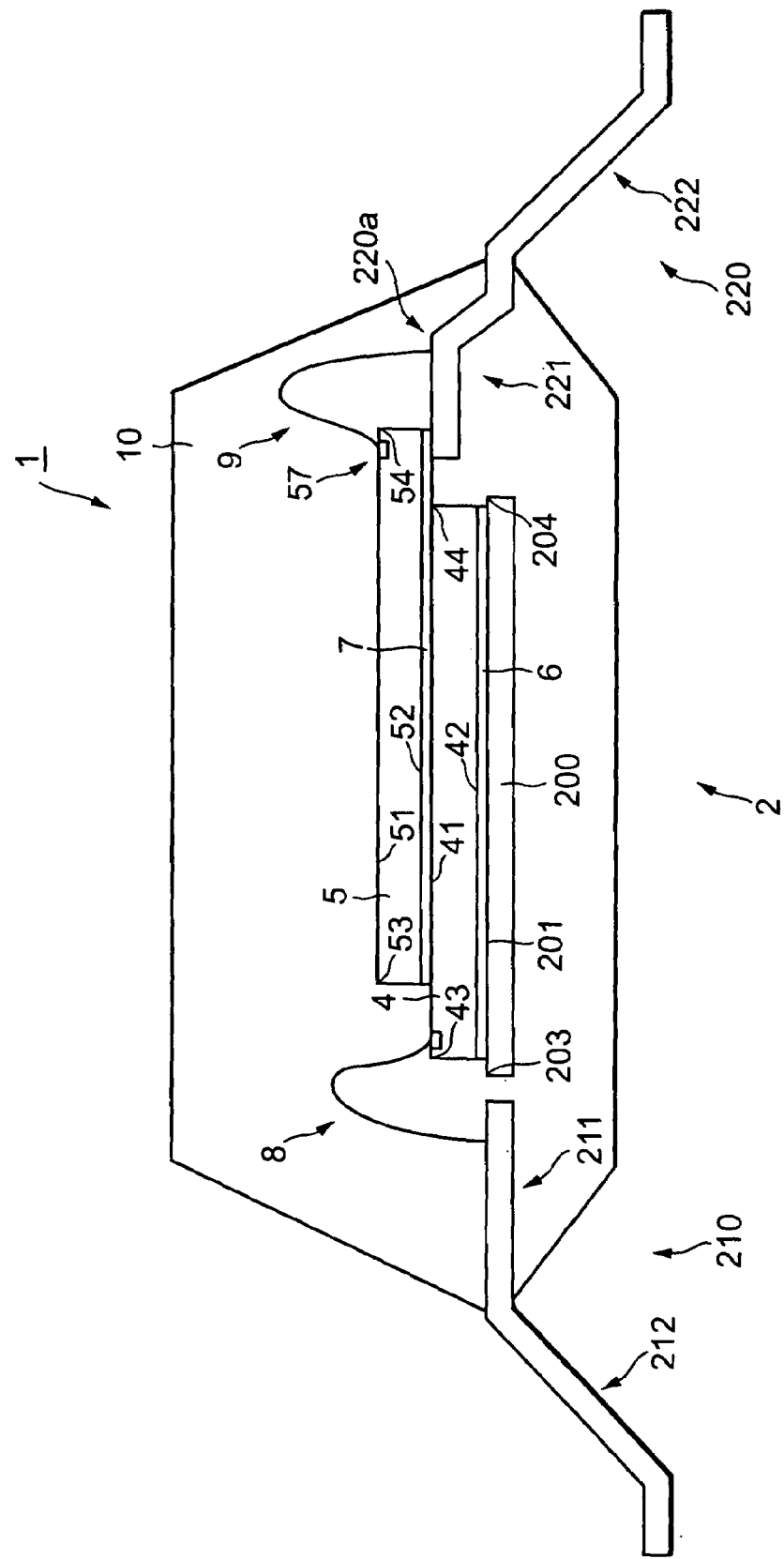
FIG. 13 is a cross-sectional view of the semiconductor device 1 according to the third embodiment of the present invention.

FIGS. 12 and 13 are respectively a plan view and a sectional view of a semiconductor device 1 according to a third embodiment of the present invention. Components similar to those employed in the first embodiment are respectively identified by the same reference numerals, and the description thereof will therefore be omitted.

In the present embodiment, a lead terminal section 220 has a bent portion 220a on the die pad section 200 side. The bent portion 220a functions as a support member. The bent portion 220a is bent in the direction of the semiconductor chip 5 on the die pad section 200 side of the lead terminal section 220 and extends along a surface 52 of a semiconductor chip 5 at the same vertical position as a surface 41 of a semiconductor chip 4. The semiconductor chip 5 is bonded onto the surface 41 of the semiconductor chip 4 and the bent portion 220a by an adhesive sheet 7.

Figure 14:
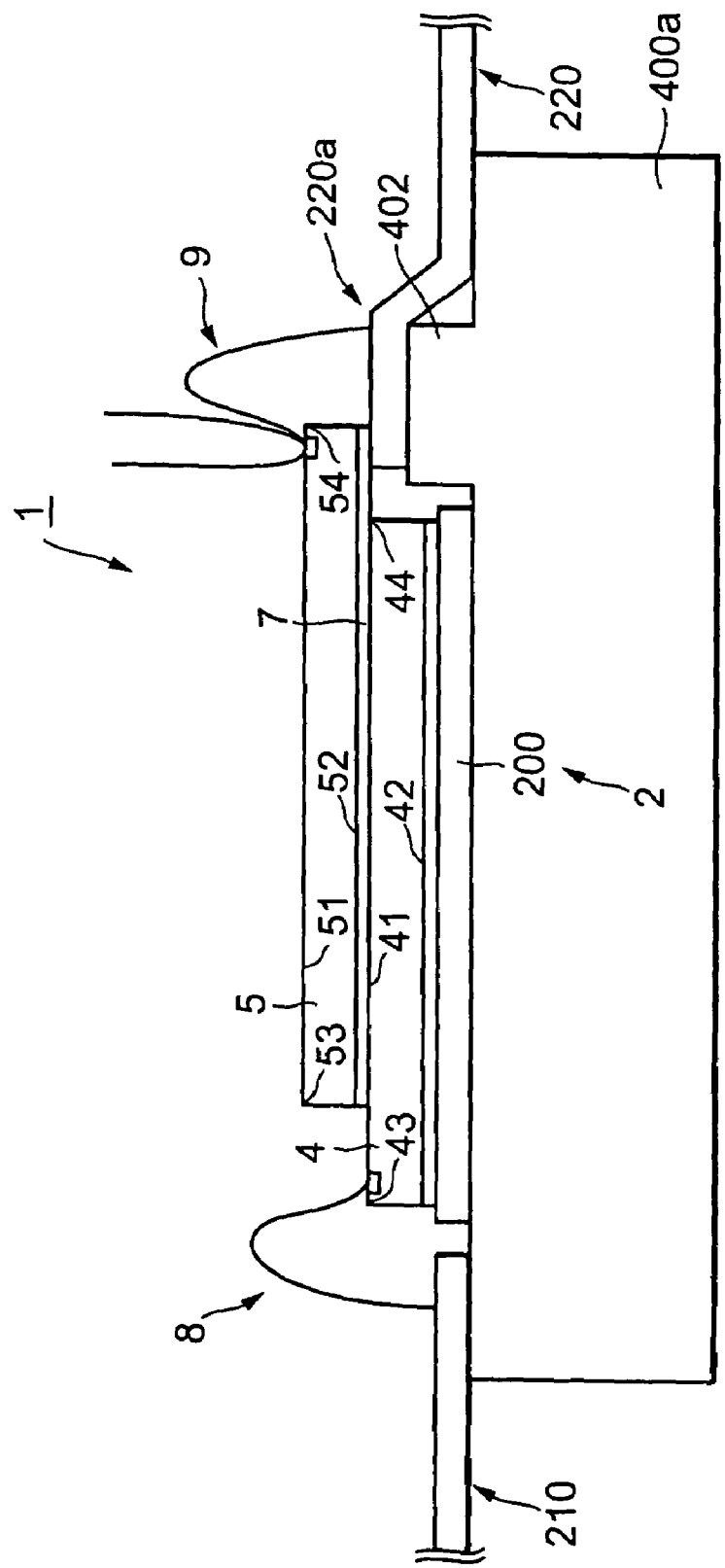
FIG. 14 is a view for describing wire bonding employed in the semiconductor device 1 according to the third embodiment of the present invention.

Upon wire bonding, a lead frame 2 is placed on a heat coma 400a having a portion 402 that protrudes so as to contact the bent portion 220a as shown in FIG. 14. That is, the protruding portion 402 of the heat coma 400a is disposed so as to make contact with the lower surface of the bent portion 220a. If the wire bonding is performed in this state, then heat applied from the protruding portion 402 of the heat coma 400a is satisfactorily transferred to a protruding or extended-out portion of the semiconductor chip 5 through the bent portion 220a. Since the bent portion 220a is brought into contact with the lower surface (surface 52) of the protruding portion of the semiconductor chip 5, an ultrasonic sound produced from a capillary is transferred to metal wires (wiring section 9) satisfactorily. Consequently, electrodes and their corresponding metal wires can be reliably connected at the protruding portion.

Since the extended-out portion of the semiconductor chip 5 is fixed by the bent portion 220a of the lead terminal section 220 even if a resin flows below the protruding portion so that a force for pushing up the protruding portion upwardly is applied upon resin sealing, the movement of the semiconductor chip 5 in an upward direction is brought under control and the occurrence of a crack due to application of an excessive force to the semiconductor chip 5 can be prevented.

Since the bent portion 220a of the lead terminal section 220 of the lead frame is used as the support member, there is no need to additionally provide a support member and there is also no need to fabricate the support member and build it into the semiconductor wafer together with the semiconductor chip 4. Further, since the support member can be obtained by simple processing that the lead terminal section 220 is folded back, a cost reduction of the semiconductor device 1 can be achieved.

<Other Embodiment>

Figure 15:
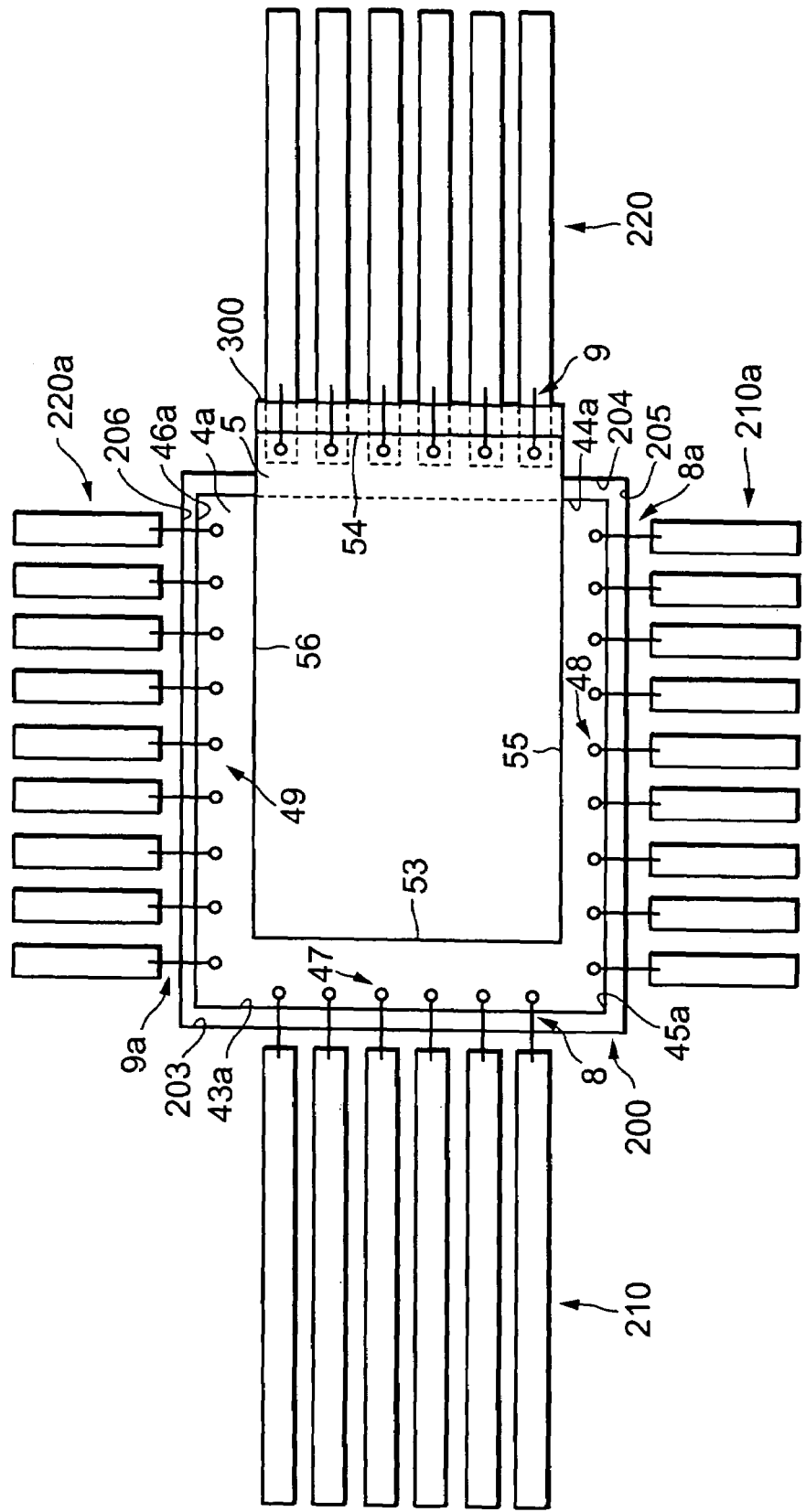
FIG. 15 is a plan view of another embodiment of the present invention.

Although the above embodiments have respectively explained the case in which the semiconductor chips 4 and 5 have the same shape and size, the present invention can be applied even to a case in which short sides 43a and 44a of a lower semiconductor chip 4a are respectively longer than short sides 53 and 54 of an upper semiconductor chip 5 as shown in FIG. 15.

In FIG. 15, the short sides 43a and 44a of the semiconductor chip 4a are respectively longer than the short sides 53 and 54 of the semiconductor chip 5, whereas long sides 45a and 46a thereof are identical in length to long sides 55 and 56 of the semiconductor chip 5. Electrode sections 48 and 49 are respectively disposed along the sides 45a and 46a of the semiconductor chip 4a, and lead terminal sections 210a and 220a are respectively disposed along sides 205 and 206 of a die pad section 200. Respective electrodes of the electrode sections 48 and 49 are connected to their corresponding lead terminals of the lead terminal sections 210a and 220a by metal wires of wiring sections 8a and 9a. Thus, even when the electrodes (electrode sections 47, 48 and 49) are disposed along the three sides (sides 43, 45 and 46) of the lower semiconductor chip 4, a support member 300 is interposed between a protruding portion of the side 54 of the semiconductor chip 5, which extends out from the side 44 of the semiconductor chip 4, and a lead frame 2, whereby operations and effects similar to those obtained in the first and second embodiments can be obtained. In the semiconductor device 1 of FIG. 15, the bent portion 220a is provided in the lead terminal section 220 in a manner similar to the third embodiment and the protruding portion may be supported by the bent portion 220a.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
   a lead frame including a die pad section and leads having lead terminal sections;
   a first semiconductor chip having a surface on which a first electrode section is formed, and a back surface fixed to the die pad section;
   a second semiconductor chip having a surface on which a second electrode section is formed, and a back surface fixed to the surface of the first semiconductor chip;
   a support member having a surface fixed to the back surface of the second semiconductor chip and a back surface fixed to the die pad section, the;
   lead terminal sections respectively electrically connected to the first and second electrode sections; and
   a resin encapsulating body that seals the die pad section, the first and second semiconductor chips and the support member,
   wherein a first side surface of the support member is located directly under the second semiconductor chip, and a second side surface of the support member opposite the first side surface is located out from under the second semiconductor chip.

2. A semiconductor device according to claim 1, wherein the first semiconductor chip and the second semiconductor chip respectively have electric circuits each having the same function.

3. A semiconductor device according to claim 1, wherein the first semiconductor chip and the second semiconductor chip have the same shape and size respectively.

4. A semiconductor device according to claim 1, wherein the support member is formed in isolation from the first semiconductor chip.

5. A semiconductor device according to claim 1, wherein the surface of the first semiconductor chip has first and second sides opposite to each other,
   the surface of the second semiconductor chip has third and fourth sides opposite to each other, and
   the fourth side of the second semiconductor chip protrudes from the second side of the first semiconductor chip, and the fourth side thereof is located directly above the support member.

6. A semiconductor device according to claim 1, wherein the first and second semiconductor chips extend in a same first direction so as to be disposed in parallel with respect to each other.

7. A semiconductor device according to claim 1, wherein the first side surface of the support member, and a side surface of the first semiconductor chip that opposes the first side surface, directly contact each other.

8. A semiconductor device according to claim 1, wherein a gap exists between the first side surface of the support member and a side surface of the first semiconductor chip that opposes the first side surface.

9. A semiconductor device according to claim 1, wherein a portion of the back surface of the first semiconductor chip is fixed to inner portions of the lead terminal sections that are within the resin encapsulating body.

10. A semiconductor device according to claim 9, wherein the die pad section and the lead terminal sections are part of a lead frame.

11. A semiconductor device according to claim 1, wherein the support member is an insulator.

12. A semiconductor device according to claim 1, wherein the support member is a conductor.

13. A semiconductor device according to claim 1, wherein the support member is formed integrally with the first semiconductor chip.

14. A semiconductor device according to claim 13, wherein the first semiconductor chip and the support member are formed in a semiconductor wafer and thereafter formed separately in an integral state.

15. A semiconductor device comprising:
  a lead frame including a die pad section and leads having lead terminal sections;
  a first semiconductor chip having a surface on which a first electrode section is formed, and a back surface fixed to the die pad section;
  a second semiconductor chip having a surface on which a second electrode section is formed, and a back surface fixed to the surface of the first semiconductor chip;
  a support member having a surface fixed to the back surface of the second semiconductor chip and a back surface fixed to the die pad section and first portions of the lead terminal sections;
  wirings respectively electrically connecting the first and second electrode sections to the first portions of the lead terminal sections; and
  a resin encapsulating body that seals the die pad section, the first portions of the lead terminal sections, the first and second semiconductor chips and the support member.

16. A semiconductor device according to claim 15, wherein a first side surface of the support member is located directly under the second semiconductor chip, and a second side surface of the support member opposite the first side surface is located out from under the second semiconductor chip.

17. A semiconductor device according to claim 15, wherein the first and second semiconductor chips extend in a same first direction so as to be disposed in parallel with respect to each other.

18. A semiconductor device according to claim 15, wherein a first side surface of the support member, and a side surface of the first semiconductor chip that opposes the first side surface, directly contact each other.

19. A semiconductor device according to claim 15, wherein a gap exists between a first side surface of the support member and a side surface of the first semiconductor chip that opposes the first side surface.

20. A semiconductor device according to claim 15, wherein the support member is an insulator.

21. A semiconductor device according to claim 15, wherein the support member is a conductor.

* * * * *